(12) United States Patent
Sager et al.

(10) Patent No.: US 7,858,151 B2
(45) Date of Patent: Dec. 28, 2010

(54) FORMATION OF CIGS ABSORBER LAYER MATERIALS USING ATOMIC LAYER DEPOSITION AND HIGH THROUGHPUT SURFACE TREATMENT

(75) Inventors: Brian M. Sager, Menlo Park, CA (US); Martin R. Roscheisen, San Francisco, CA (US); Craig Leidholm, Sunnyvale, CA (US)

(73) Assignee: Nanosolar, Inc., San Jose, CA (US)

( * ) Notice: Subject to any disclaimer, the term of this patent is extended or adjusted under 35 U.S.C. 154(b) by 861 days.

(21) Appl. No.: 10/943,658

(22) Filed: Sep. 18, 2004

(65) Prior Publication Data
US 2005/0186342 A1    Aug. 25, 2005

Related U.S. Application Data

(63) Continuation-in-part of application No. 10/782,545, filed on Feb. 19, 2004, now Pat. No. 7,115,304.

(51) Int. Cl.
C23C 16/00    (2006.01)
(52) U.S. Cl. .............................. 427/255.34; 427/248.1; 427/255.5; 427/251; 427/255.28
(58) Field of Classification Search ............... 427/248.1
See application file for complete search history.

(56) References Cited

U.S. PATENT DOCUMENTS 3,109,877 A * 11/1963 Wilson ........................ 266/252
3,114,539 A    12/1963 Lee et al.
3,923,556 A * 12/1975 Iszczukiewicz ............. 148/601

(Continued)

FOREIGN PATENT DOCUMENTS

DE    10006778 A1    8/2001

(Continued)

OTHER PUBLICATIONS

Ramanathan, K., Contreras, M.A., Perkins, C.L., Asher, S., Hasoon, F.S., Keane, J., Young, D., Romero, M., Metzger, W., Noufi, R., Ward, J., and Duda, A., "Properties of 19.2% Efficiency ZnO/CdS/CuInGaSe2 Thin-film Solar Cells," Progress in Photovoltaics: Research and Applications, 11 : 225-230, Jun. 2003.*

(Continued)

*Primary Examiner*—David Turocy (57) ABSTRACT

An absorber layer may be formed on a substrate using atomic layer deposition reactions. An absorber layer containing elements of groups IB, IIIA and VIA may be formed by placing a substrate in a treatment chamber and performing atomic layer deposition of a group IB element and/or one or more group IIIA elements from separate sources onto a substrate to form a film. A group VIA element is then incorporated into the film and annealed to form the absorber layer. The absorber layer may be greater than about 25 nm thick. The substrate may be coiled into one or more coils in such a way that adjacent turns of the coils do not touch one another. The coiled substrate may be placed in a treatment chamber where substantially an entire surface of the one or more coiled substrates may be treated by an atomic layer deposition process. One or more group IB elements and/or one or more group IIIA elements may be deposited onto the substrate in a stoichiometrically controlled ratio by atomic layer deposition using one or more self limiting reactions.

56 Claims, 3 Drawing Sheets

U.S. PATENT DOCUMENTS

| | | | |
|---|---|---|---|
| 4,058,430 A | | 11/1977 | Suntola et al. ......... 427/255.13 |
| 4,416,912 A | * | 11/1983 | Bache ......................... 427/467 |
| 4,427,714 A | * | 1/1984 | Davey ........................ 438/479 |
| 4,492,181 A | * | 1/1985 | Ovshinsky et al. .......... 118/718 |
| 5,016,562 A | | 5/1991 | Madan et al. |
| 5,092,939 A | * | 3/1992 | Nath et al. .................. 136/251 |
| 5,273,911 A | | 12/1993 | Sasaki et al. |
| 5,436,204 A | * | 7/1995 | Albin et al. ................. 438/488 |
| 5,482,570 A | | 1/1996 | Saurer et al. |
| 5,525,440 A | | 6/1996 | Kay et al. |
| 5,567,469 A | * | 10/1996 | Wada et al. .................... 427/74 |
| 5,571,612 A | | 11/1996 | Motohiro et al. |
| 5,578,503 A | * | 11/1996 | Karg et al. ..................... 438/95 |
| 5,614,273 A | | 3/1997 | Goedicke et al. |
| 5,674,325 A | | 10/1997 | Albright et al. |
| 5,908,507 A | | 6/1999 | Onabe et al. |
| 5,986,206 A | | 11/1999 | Kambe et al. |
| 5,990,415 A | | 11/1999 | Green et al. |
| 6,075,203 A | | 6/2000 | Wang et al. |
| 6,107,562 A | * | 8/2000 | Hashimoto et al. .......... 136/252 |
| 6,186,090 B1 | | 2/2001 | Dotter et al. |
| 6,270,846 B1 | | 8/2001 | Brinker et al. ............ 427/385.5 |
| 6,278,056 B1 | | 8/2001 | Sugihara et al. |
| 6,291,763 B1 | | 9/2001 | Nakamura |
| 6,340,789 B1 | | 1/2002 | Petritsch et al. |
| 6,716,693 B1 | | 4/2004 | Chan et al. |
| 6,743,475 B2 | | 6/2004 | Skarp et al. |
| 6,830,983 B2 | | 12/2004 | Marsh |
| 6,838,114 B2 | | 1/2005 | Carpenter et al. |
| 6,861,094 B2 | | 3/2005 | Derderian et al. |
| 6,875,667 B2 | | 4/2005 | Iizuka et al. |
| 7,045,205 B1 | | 5/2006 | Sager |
| 7,115,304 B2 | | 10/2006 | Roscheisen |
| 2002/0013487 A1 | | 1/2002 | Norman et al. |
| 2002/0017656 A1 | | 2/2002 | Graetzel et al. |
| 2002/0043278 A1 | * | 4/2002 | Hashimoto et al. .......... 136/255 |
| 2002/0108570 A1 | * | 8/2002 | Lindfors ..................... 118/715 |
| 2002/0134426 A1 | | 9/2002 | Chiba et al. |
| 2002/0192441 A1 | | 12/2002 | Kalkan et al. |
| 2003/0064153 A1 | * | 4/2003 | Solanki et al. ......... 427/255.28 |
| 2003/0226498 A1 | | 12/2003 | Alivisatos et al. |
| 2004/0001922 A1 | | 1/2004 | Meyer |
| 2004/0084080 A1 | | 5/2004 | Sager et al. |
| 2004/0118448 A1 | | 6/2004 | Scher et al. |
| 2004/0159285 A1 | | 8/2004 | Doehler et al. |
| 2004/0201027 A1 | | 10/2004 | Ghosh |
| 2004/0219730 A1 | | 11/2004 | Basol ......................... 438/200 |
| 2004/0250848 A1 | | 12/2004 | Sager et al. |
| 2005/0045874 A1 | | 3/2005 | Xiao et al. |
| 2005/0084610 A1 | | 4/2005 | Selitser |
| 2005/0121068 A1 | | 6/2005 | Sager et al. |
| 2005/0172897 A1 | | 8/2005 | Jansen |
| 2007/0111367 A1 | | 5/2007 | Basol |
| 2008/0095938 A1 | | 4/2008 | Basol |
| 2008/0175993 A1 | | 7/2008 | Ashjace et al. |

FOREIGN PATENT DOCUMENTS

| | | |
|---|---|---|
| EP | 1028475 | 8/2000 |
| EP | 1087446 | 3/2001 |
| WO | WO/2005/081789 A1 | 9/2005 |
| WO | WO/2005/081789 A3 | 9/2005 |
| WO | WO/2006/033858 A1 | 3/2006 |
| WO | WO/2006/033858 A3 | 3/2006 |
| WO | WO/2007/047888 A2 | 4/2007 |
| WO | WO/2007/047888 A3 | 4/2007 |

OTHER PUBLICATIONS

Juppo, M., Vehkamäki, M., Ritala, M., and Leskelä, M., "Deposition of molybdenum thin films by an alternate supply of MoCl5 and Zn," J. Vac. Sci. Technol. A 16 (5) : 2845-2850, Sep./Oct. 1998.*

Lujala, V., Skarp, J. Tammenmaa, M., and Suntola, T., "Atomic layer epitaxy growth of doped zinc oxide thin films from organometals," Applied Surface Science, 82/83: 34-40, 1994.*

U.S. Appl. No. 10/782,545 titled "High Throughput Surface Treatment on Coiled Flexible Substrates", filed Feb. 19, 2004.

U.S. Appl. No. 10/782,233, titled "Roll-To-Roll Atomic Layer Deposition Method and System", filed Feb. 19, 2004.

U.S. Appl. No. 10/782,017, titled "Solution-Based Fabrication of Photovoltaic Cell", filed Feb. 19, 2004.

U.S. Appl. No. 10/943,685, titled "Formation of CIGS Absorber Layers on Foil Substrates", Filed Sep. 18, 2004.

M.A. Cameron et al., "Atomic Layer Deposition of $SiO_2$ and $TiO_2$ in Alumina Tubular Membranes: Pore Reduction and Effect of Surface Species on Gas Transport" in *Langmuir 2000*, vol. 16, pp. 7345-7555, published on the web, Jun. 10, 2000, American Chemical Society.

K. Ramanathan et al., 2003. Properties of 19.2% Efficiency ZnO/CdS/CuInGaSe$_2$ Thin-Film Solar Cells. *Progress in Photovoltaics: Research and Applications*. vol. 11 2003, pp. 225-230).

S.M. George et al. "Surface Chemistry for Atomic Layer Growth", *J. Phys. Chem.* 100, 13121-13131 (1996).

Jan Sterner in "ALD Buffer Layer Growth and Interface Formation on Cu(In, Ga)Se$_2$ Solar Cell Absorbers", *Comprehensive Summaries of Uppsala Dissertations From the Faculty of Science and Technology 942*, Acta Universitatis Upsaliensis, Uppsala, Sweden 2004.

J.W. Elam et al, "Properties of ZnO/Al$_2$O$_3$ Alloy Films Grown Using Atomic Layer Deposition Techniques" Journal of The Electrochemical Society, vol. 150 No. 6, pp. G339-G347 (2003).

M. Nanu et al. "Inorganic Nanocomposites of n- and p-type semiconductors: A New Type of Three-Dimensional Solar Cell" *Advanced Materials*, vol. 16, No. 5, pp. 453-456, Mar. 5, 2004.

M. Nanu et al. "Nanocomposite of TiO2 and CuInS2: towards solid-state 3D solar cells", 2004, Chemical Vapor Deposition vol. 10 (1), pp. 45-49.

Olle Lundberg in "Band Gap Profiling and High Speed Deposition of Cu(in,Ga)Se$_2$ for Thin Film Solar Cells", *Comprehensive Summaries of Uppsala Dissertations From the Faculty of Science and Technology 903*, Acta Universitatis Upsaliensis, Uppsala, Sweden 2003.

M. Juppo, M. Vehkamaki, M. Ritala, and M. Leskela, *Deposition of molybdenum thin films by an alternate supply of MoCl5 and Zn*, Journal of Vacuum Science & Technology A 16 (5), (1998) 2845, which is incorporated herein by reference).

McCandless, B.E. and W.N. Sharfarman, "Chemical Surface Deposition of Ultra-Thin Cadmium Sulfide Films for High Performance and High Cadmium Utilization", 3$^{rd}$ World Conference on Photovoltaic Energy Conversion, Osaka, Japan, 2003.

T.E. Lister and J.L. Stickney, "Formation of the first monolayer of CdSe on Au(111) by Electrochemical ALE", Appl. Surface Science, 107(1996),153.

J. Sundqvist, "Employing metal iodides and oxygen in ALD and CVD of functional metal oxides" Comprehensive summaries of Uppsala dissertations from the faculty of science and technology, Uppsala University, 2003.

V. Lujala, in "Atomic layer epitaxy growth of doped zinc oxide films from organometals" *Applied Surface Science* 82/83: pp. 34-40, 1994.

R. Nomura et al. "Preparation of CuInS$_2$, Thin Films by Single-Source MOCVD Process using Bu$_2$In(SPr)Cu(S$_2$CNPr$^1$$_2$)" J. Mater. Chem., 1992,2(7), 765-766.

R. Nomura et al. "Preparation of CuIn$_5$S$_8$, Thin Films by Single-Source Organometallic Chemical Vapour Deposition", Thin Solid Films, 209 (1992) pp. 145-147.

M. Nanu, et al., "CuInS2 Thin Films Deposited by ALD", Chem Vap. Depositon vol. 10 No. 4, pp. 45-49 (2004).

U.S. Appl. No. 12/044,899, filed Mar. 7, 2008 entitled "Deposition of CIGS Absorber Layer Materials by Atomic Layer Deposition and High Throughput Surface Treatment" which claims the benefit of U.S. Appl. No. 10/943,658.

U.S. Appl. No. 12/110,247, filed Apr. 25, 2008 entitled "Deposition of CIGS Absorber Layer Materials by Atomic Layer Deposition and High Throughput Surface Treatment" which claims the benefit of U.S. Appl. No. 10/943,658.

U.S. Appl. No. 12/110,252, filed Apr. 25, 2008 entitled "Deposition of CIGS Absorber Layer Materials by Atomic Layer Deposition and High Throughput Surface Treatment" which claims the benefit of U.S. Appl. No. 10/943,658.

U.S. Appl. No. 12/429,162, filed Apr. 23, 2009 entitled "Deposition of CIGS Absorber Layer Materials by Atomic Layer Deposition and High Throughput Surface Treatment" which claims the benefit of U.S. Appl. No. 10/943,658.

Office Action from U.S. Appl. No. 12/110,252 dated Sep. 18, 2009.

Office Action from U.S. Appl. No. 12/044,899 dated Jan 27, 2010.

Office Action from U.S. Appl. No. 10/782,233 dated Jul. 11, 2007.

Office Action from U.S. Appl. No. 10/782,233 dated May 13, 2008.

Office Action from U.S. Appl. No. 10/782,233 dated Jan. 16, 2009.

Office Action from U.S. Appl. No. 10/782,233 dated Oct. 19, 2009.

Office Action from U.S. Appl. No. 10/782,163 dated Mar. 18, 2005.

Office Action from U.S. Appl. No. 10/782,163 dated Aug. 8, 2005.

Penndorf et al. "CuInS2 thin film formation on a Cu tape substrate for photovoltaic application" Solar Energy Material and Solar Cells 53 (1998) 285-298.

* cited by examiner

FORMATION OF CIGS ABSORBER LAYER MATERIALS USING ATOMIC LAYER DEPOSITION AND HIGH THROUGHPUT SURFACE TREATMENT

CROSS-REFERENCE TO RELATED APPLICATION

This application is a continuation-in-part of commonly-assigned U.S. patent application Ser. No. 10/782,545, which was filed Feb. 19, 2004 now U.S. Pat. No. 7,115,304, the entire disclosures of which are incorporated herein by reference. This application is also related to commonly-assigned, co-pending application Ser. No. 10/782,233, titled "ROLL-TO-ROLL ATOMIC LAYER DEPOSITION METHOD AND SYSTEM", which was filed Feb. 19, 2004, the entire disclosures of which are incorporated herein by reference. This application is also related to commonly-assigned co-pending application Ser. No. 10/782,017, titled "SOLUTION-BASED FABRICATION OF PHOTO VOLTAIC CELL", which was filed Feb. 19, 2004, the entire disclosures of which are incorporated herein by reference. This application is also related to commonly-assigned co-pending application Ser. No. 10/943,685, titled "FORMATION OF CIGS ABSORBER LAYERS ON FOIL SUBSTRATES", which is filed the same day as the present application, the entire disclosures of which are incorporated herein by reference.

FIELD OF THE INVENTION

The present invention is directed to the deposition and/or surface treatment of thin films on large area substrates and more specifically to atomic layer deposition in a high-throughput production system.

BACKGROUND OF THE INVENTION

Low-cost production of solar cells on flexible substrates using printing or web coating technologies is promising highly cost-efficient alternative to traditional silicon-based solar cells.

A typical Copper-Indium-Gallium-diSelenide (CIGS) solar cell structure includes a back electrode followed by a layer of molybdenum (Mo). A CIGS absorber layer is sandwiched between the Mo layer and a CdS junction partner layer. A transparent conductive oxide (TCO) such as zinc oxide ($ZnO_x$) or tin oxide ($SnO_2$) formed on the CdS junction partner layer is typically used as a transparent electrode.

A central challenge in constructing a highly efficiency CIGS-based solar cell is that the elemental components of the CIGS layer must be present in a fairly narrow stoichiometric ratio relative to one another in order for the resulting cell to be highly efficient. It is difficult to control the stoichiometric ratios and achieve high volume production with prior art techniques. Furthermore, it would be highly desirable to vary the composition of a CIGS absorber layer as a function of depth. There are numerous advantages to varying the relative concentrations of the components of the CIGS absorber layer. These advantages include (1) improved open circuit voltage; (2) improved short circuit current density; and (3) improved optoelectronic quality in the absorber layer. A detailed discussion of these and other advantages may be found in Olle Lundberg in "Band Gap Profiling and High Speed Deposition of Cu(In, Ga)$Se_2$ for Thin Film Solar Cells", *Comprehensive Summaries of Uppsala Dissertations From the Faculty of Science and Technology* 903, Acta Universitatis Upsaliensis, Uppsala, Sweden 2003, which is incorporated herein by reference.

More specifically, higher amounts of Ga deposited at or near the back contact (e.g. near the Mo interface) of the CIGS cell promotes improved device function in two ways: (1) smaller grains form in the presence of Ga in this back region, and these smaller grains are less-mechanically stressed at the back contact, thus improving the mechanical stability of the cell and (2) the presence of higher levels of CuGa at the back of the absorber layer also acts as a carrier reflector, directing carriers forward to the junction at the front of the absorber layer.

Second, a relatively high level of Ga in the middle of the CIGS absorber layer negatively impacts device function, as small CuGaSe grains form. These small grains tend to have a high defect density and act as sites for charge recombination in the absorber layer.

Third, high amounts of Ga deposited at or near the front contact (e.g. near the TCO layer) of the CIGS cell can promote improved device function in two ways: (1) a higher bandgap (e.g. 1.35 eV) near the front contact sets the voltage of the cell at a relatively higher value than would otherwise exist, and (2) such a higher voltage couples with a lower current results in the same power conversion efficiency but with fewer $I^2R$ losses.

In the prior art, graded bandgap devices with graded concentration profiles have been prepared using co-evaporation from elemental and/or alloy sources, and have produced the best performing CIGS solar cells recorded to date. For example, Ramanathan and coworkers at the National Renewable Energy Laboratory showed a cell having a 19.2% conversion efficiency with a fill factor of 78.12%, Jsc=35.71 mA/cm$^2$, and an open-circuit voltage of 0.69 V using this approach (see K. Ramanathan et al., "Properties of 19.2% Efficiency ZnO/CdS/CuInGaSe$_2$ Thin-Film Solar Cells", *Progress in Photovoltaics: Research and Applications*. Vol. 11 2003, pp. 225-230).

Unfortunately, there are several challenges and disadvantages associated with evaporation as a deposition technique for the CIGS absorber layer. For example, it is difficult to deposit many compounds and alloy compositions by evaporation. Evaporation deposition is limited to line-of-sight and limited-area sources, which tends to result in poor surface coverage and spatial non-uniformity. Line-of-sight trajectories and limited-area sources can also result in poor film-thickness uniformity over large areas. In addition, evaporation deposition techniques typically have relatively few processing parameters that can be varied to tune the properties of the resulting film. Furthermore, the intermixing of the elements from evaporative sources occurs not only atomically but also as the interaction of discrete atomic clusters, resulting in locally non-uniform deposition in all three dimensions. Such non-uniformity also alters the local stoichiometric ratios of the absorber layer, decreasing the potential power conversion efficiency of the complete device. Further, the use of evaporation can result in uneven surfaces that can further degrade the device performance.

Moreover, the use of evaporation as a deposition mechanism to grade the bandgap provides at best a rough tuning. It is extremely difficult, if not impossible to reproducibly control the gradation of the individual components of the absorber layer at the atomic or sub-monolayer level. Such reproducible control would be desirable for the formation of precisely structured bandgap gradients in the absorber layer. Reproducible, atomic-level gradation of the relative amounts of deposited elements and/or alloys would allow a higher-yield optimization of the completed device. Finally, the creation of a bandgap graded absorber layer using evaporative sources requires a relatively expensive real-time monitoring system to assess the relative composition of the absorber layer as it is being constructed.

Chemical vapor deposition (CVD) of copper indium disulfide (CIS) films was first reported in 1992, when a single-source precursor was used in metal organic CVD to produce a photo-responsive light absorbing film, though not in a solar cell (see Nomura, R., Seki, Y. and H. Matsuda, 1992, "Preparation of $CuInS_2$ Thin Films by Single-source MOCVD Process using $Bu_2In(SPr)Cu(S_2CNPr_2)$," J. Mater. Chem. 2 (7): pp 765-766). Since the elements in the film derived from a single source, the stochiometric ratio of these elements in the resulting films could not be altered relative to one another, leading to the inability to tune and optimize the optoelectronic and electronic properties of the deposited film. Further, no bandgap grading was possible. Finally, sulfur rather than selenium was used in the films, which limits the potential for large grain growth. In particular, large grains only form in sulfur-containing CIS films in Cu-rich regions. In such copper-rich regions, copper sulfide forms, and this compound needs to be removed e.g. with a potassium cyanide etch for proper device function.

More recently, Atomic Layer Deposition (ALD) has been used in the fabrication of a film comprised of aggregates of CIS-coated titania spheroids as the active layer of inorganic solar cells (see e.g., Nanu, M., Schoonman, J. and A. Goossens, 2004, "Inorganic Nanocomposites of n- and p-type Semiconductors: A New Type of Three-Dimensional Solar Cell," Adv. Mater. 5 (5): pp 453-455 and Nanu, M., Reijnen, L., Meeester, B., Schoonman, J. and A. Goossens, 2004, Chemical Vapor Deposition 10 (1): 45-49) which are incorporated herein by reference. In this approach, the aggregated titania spheroids were coated with 25 nm of CIS film using ALD, a high-quality thin-film deposition technique based on sequential, self-limiting surface reactions. Atomic layer deposition works by exposing a substrate sequentially to two or more reactant vapors or solutions and maintaining the substrate temperature within, for example, a temperature range that depends on the chemistry of the particular ALD reaction. A typical ALD process involves a sequence of two different and alternating surface reactions involving two different gaseous reactants referred to herein as A and B. The ALD system is typically purged of reactant gas in between reactions with a non-reactive purge gas C, and/or is pumped clean of the reactant gases. Sequencing the reactions provides precision in the rate of deposition and allows the use of highly reactive reactants. With each reactant exposure, a self-limiting reaction occurs on the surface of the substrate if the substrate temperature is, for example, within the right temperature range, or if alternative energy sources are provided, such as energetic ions or molecules or atoms, ozone, plasma, UV light, etc.

ALD can control the thickness of deposited films at the level of an atomic or sub-atomic layer. Thus films deposited by ALD tend to be uniform over large areas. In addition ALD allows deposition of conformal films on structures having very high aspect ratios (e.g., >>10). A wide variety of materials may be deposited by ALD, including semiconductors, metals, oxides, nitrides, and other materials. ALD techniques can thus deposit thin films one atomic layer at a time, in a "digital" fashion. Such "digital" build-up of material greatly simplifies thickness control, thus reducing both the complexity and cost of thin film deposition.

Many industries, such as the optoelectronics industry, can benefit from the high uniformity, high aspect ratio conformal coating abilities and low cost of ALD. Unfortunately, prior art ALD systems have mostly been made for semiconductor wafer processing, which is oriented to batch processed wafer handling systems. Although existing ALD systems are suitable for the semiconductor industry, they are unsuitable for high volume manufacturing of large area devices such as photovoltaic cells. Current systems are typically designed to coat small area wafers. Scaling up systems that coat a small area at a time might not be practical for coating large area sheets, panels or rolls of material. ALD may be too slow and expensive overall, if only small area batch processing can be performed. Further, surface treatments such as annealing, drying, and exposure to reactive gases cannot be carried out at high-volume for large-area substrates when the surface treatments and/or reactions take place in a relatively smaller treatment chamber.

In particular, current ALD deposition approaches for the construction of thin-film absorber materials in CIS solar cells are limited to relatively thin films, e.g. less than 25 nm, since thicker deposits of absorber material are impractical to form due to the slow rate of deposition. Thin films of CIS material are not optimal as an absorber component for solar cells, since the majority of the light reaching a 25 nm thick absorber layer is not absorbed by that material, limiting the potential power conversion efficiency of such a solar cell. Further, CIS absorbers have a narrower bandgap and tighter processing conditions than CIGS absorbers, where Ga is incorporated into the crystal structure of the absorbing semiconductor layer. Finally, to achieve efficient power conversion, it is very desirable for the relative ratios of the individual elements comprising a CIS or CIGS film within a solar cell to have a graded distribution through the absorber layer depth. This is very difficult or impossible to achieve with such a thin (e.g. 25 nm) absorber layer, for which it is inherently challenging to establish initial elemental gradients with a proper distribution, and where atomic intermixing at that length scale will tend to minimize any elemental gradients.

Thus, there is a need in the art, for a high throughput method and system for fabricating thick films of elementally-graded and optimized CIGS solar cells produced by ALD.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

According to embodiments of the present invention, an absorber layer may be formed on a substrate using atomic layer deposition reactions. An absorber layer containing elements of groups IB, IIIA and VIB may be formed by placing a substrate in a treatment chamber and performing atomic layer deposition of a group IB element and/or one or more group IIIA elements from separate sources onto a substrate to form a film. A group VIA element is then incorporated into the film and annealed to form the absorber layer. In one embodiment, the treatment chamber is an elongate treatment chamber comprising of a plurality of sections wherein one or more shims are used to separate sections and narrow openings between sections. The absorber layer may be greater than about 25 nm thick. According to embodiments of the present invention, the absorber layer thickness between about 25 nm and about 5000 nm, more preferably 25 nm to 3000 nm, even more preferably 100 nm to 2000 nm, still more preferably, 500 nm to 1000 nm and most preferably 1000 nm to 2000 nm. In some embodiments, a group IB element and two different group IIIA elements (e.g., indium and gallium) may be deposited using different sources. In such embodiments the absorber layer may be between about 1 nm and about 5000 nm thick.

In atomic layer deposition systems, wherever the reactant gases A, B come in contact with substrate, good coating may be achieved. Consequently, ALD may be readily scaled to coating large substrate areas in each reaction step. Thus, the throughput of an ALD system may be increased by massively scaling the substrate surface area processed during each step (as opposed to scaling up the step speed for each deposition cycle and/or processing many substrates in parallel via, e.g. the number of ALD reaction chambers) This can be achieved by coiling a flexible substrate (e.g., metal or alloy foil, e.g. Al, metalized plastic foil, otherwise coated foils, foils with pre-deposited/processed surface structure and/or patterning, laminates, etc.) in an ALD chamber in such a way that adjacent 'turns or windings' of the foil on the carrier roll, cassette, or carousel do not touch one another. Gaps between adjacent layers of the coiled substrate allow the reactant gases to flow or diffuse into the gaps between adjacent turns and thus reach and be adsorbed or react on the substrate surface(s) to be coated. Each step of a sequence of one or more ALD reactions may then be applied to a massive surface area of the substrate. The basic concept behind the embodiments of present invention is an implementation in which each step may be applied to the entire surface area of the substrate, e.g., to an entire roll. The same approach, with appropriate modifications, can be used to scale up other surface treatment techniques such as substrate annealing, drying, anodization, electro-deposition, electro-polymerization, electro-polishing, cleaning, exposing to chemicals to treat the surface (e.g. selenization of a substrate using $H_2Se$ gas or Se vapor), solution treatments, treatments that require electric fields/current/voltage, etc. Consequently, an entire CIGS absorber layer as well as a window layer and front and back contacts may be formed in one chamber without having to remove the substrate between steps.

According to embodiments of the present invention, an absorber layer for an optoelectronic device (e.g., a photovoltaic cell) may be fabricated by atomic layer deposition of an absorber layer material containing elements from groups IB, IIIA and VIA on a coiled substrate. The coiling of the substrate increases the surface area that can be treated at one time, thereby increasing throughput and yield. In general one or more group IB elements and/or one or more group IIIA elements are deposited by atomic layer deposition in a stoichiometrically controlled ratio using one or more self limiting ALD reactions. Two or more precursor gases of the group IB and group IIIA elements may be intermixed in a mix ratio that translates into a deposition ratio of the group IB and IIIA elements on the substrate. Alternatively, the group IB and group IIIA elements may be deposited by an atomic layer deposition sequence involving two or more self-limiting single species deposition reactions with precursor gases of the group IB and group IIIA elements. In either case, the group VIA element may be deposited by performing a reaction that incorporates an element of group VIA into the absorber layer. In addition, embodiments of the present invention include combination deposition sequences involving both single species deposition reactions and mixed species deposition reactions.

One way to achieve high-volume production in ALD systems of the type described herein is to perform an ALD reaction on an entire roll of substrate material at one time. To do this, it would be useful to fit the entire length of a roll into the ALD chamber so that the A and B half-reactions can be performed without having to remove the substrate from the chamber. In another alternative embodiment, an entire roll of substrate material may be treated at one time by using a system of the type depicted in FIG. 1. The system 100 includes a surface treatment chamber 102 and a carousel 104 for coiling a flexible substrate 106 in a way that allows gaps between adjacent turns of the coil. Gas sources 108, 110 and 112 provide ALD reactants A, B and purge gas C to the chamber 102. One or more robots 114 place stackable spacers 116 on the carousel 104. An exhaust system 111 removes gas or liquid from within the chamber 102. The gas pressure within the chamber 102 may be adjusted by appropriate control of the gas sources 108, 110 and 112 and the exhaust system 111.

Figure 1:
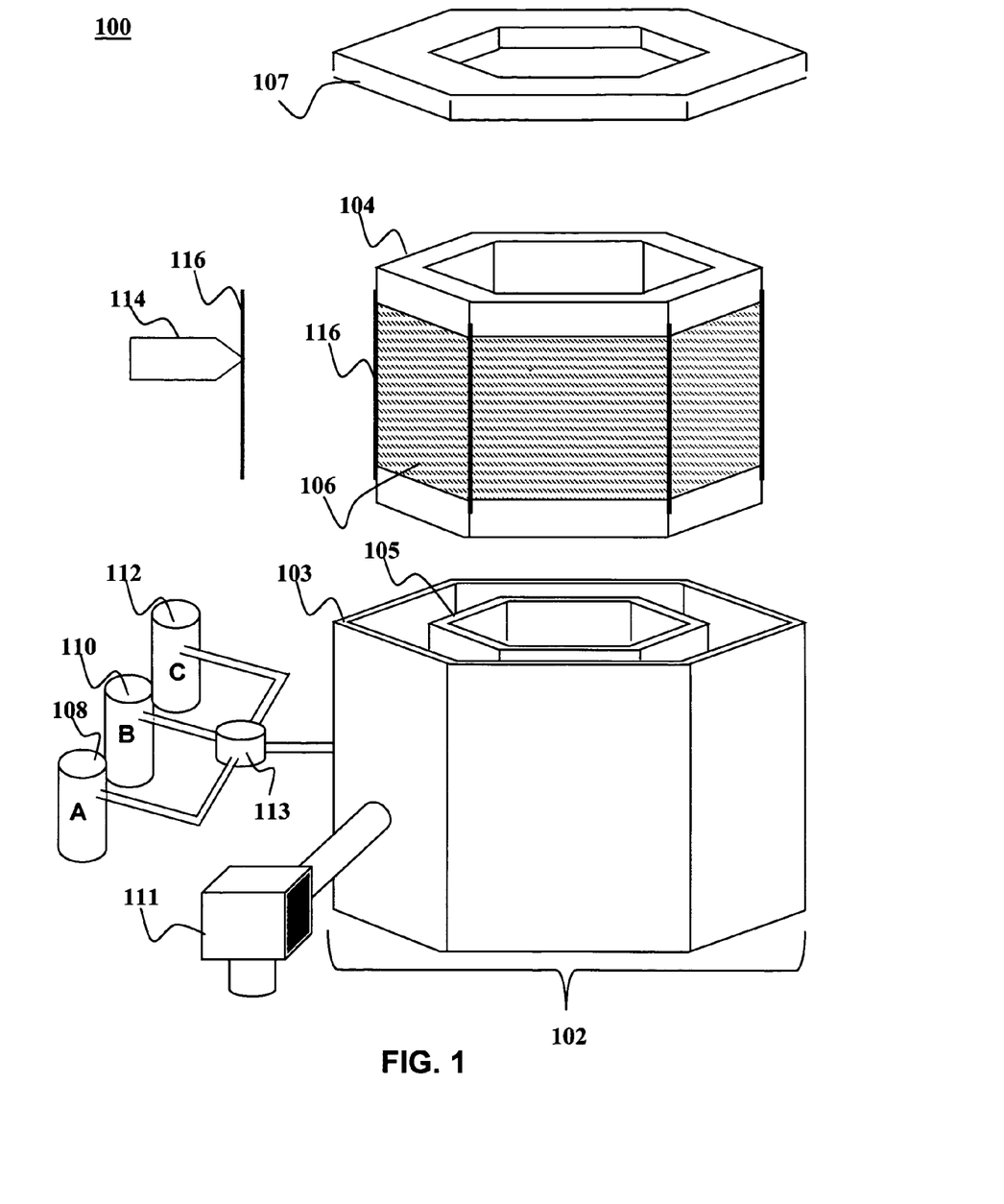
FIG. 1 is a 3-dimensional exploded view schematic diagram of a high throughput atomic layer deposition system according to an embodiment of the present invention.

By way of example, the chamber 102 may include an inner wall 103 and an outer wall 105. The substrate 106 may be wound outside the chamber 102 on the carousel 104, which fits between the inner wall 103 and the outer wall 105. The carousel 104 may be loaded into the chamber 102 through the top (or side). A lid 107 seals the top of the chamber 102. By way of example, the chamber 102 may also include equipment for pre-treatment of the substrate 106 by plasma, UV-ozone, heat (e.g., infrared), corona or combinations thereof. In addition, the chamber 102 may include equipment for performing one or more treatment and/or coating steps that are performed prior or subsequent to atomic layer deposition that is performed in the chamber 102, including but not limited to substrate cleaning, annealing, drying, and/or exposure to reactive gas such as Se vapor or $H_2Se$. Such post-ALD steps may include passivation, or coating the ALD treated substrate 106 with, e.g., an organic or inorganic material. In addition, the chamber 102 may be equipped with additional gas low inlets, heaters (e.g., infrared heaters, light sources, or ultraviolet radiation sources, sources for energetic particles such as plasma ions, ozone, etc.) or cooling mechanisms, such as fluid filled tubes or peltier effect (thermoelectric) elements. Furthermore, the chamber 102 may be part of a much larger coating line that may include other equipment for performing pre-ALD and post-ALD treatment of the substrate 106. The wound substrate can also be surface-treated in the absence of ALD processes, e.g. by carrying out substrate cleaning, and/or annealing, and/or drying, and/or exposure to reactive gas (such as Se vapor or $H_2Se$) in the absence of ALD. Further, the wound substrate can also be surface-treated in the absence of ALD processes, e.g. by carrying out anodization, electrodeposition, electroplating, electropolishing, and/or other reactions in the absence of ALD. The carousel 104 and/or surrounding chamber may include an optional substrate temperature control element (e.g., heating and/or cooling element) to maintain the temperature of the substrate 104 within a specified range.

Gas sources 108, 110, supply reactant gases A and B for sequential atomic layer deposition processes that occur in the chamber 102. Gas source 112 may supply an optional non-reactive purge gas C, e.g., an inert gas such as argon or argon. Alternatively, or in addition, reactant gases A and B (or better reactant gases A and B each mixed into a carrier gas such as nitrogen ($N_2$) or argon) could be removed via pumping. The gas sources 110, 112, 116 may selectively supply either reactant gas A or reactant gas B and/or purge gas C though one or more gas lines and one or more valves 113. Although three gas sources are depicted in FIG. 1 for the sake of example, any number of gas sources may be coupled to the chamber 102 as required to perform the desired reaction or reactions. As described above, a temperature control element may be disposed in the chamber 102 or on the carousel 104 to control the temperature of the substrate 106 and/or chamber 102. Alternatively or in addition, other energy sources could be used, such as energetic particles (from plasma, Ozone, etc.), UV light, etc. At the right range of temperature and/or presence of other energetic species and pressure each reactant gas A, B may participate in a half-reaction at the surface of the substrate 106. When the two half-reactions are performed sequentially a very thin layer of material, e.g., as little as one atomic layer or (more common) part of one monolayer, may be deposited on the substrate 106 as a result of the two half-reactions.

A typical ALD process involves a sequence of two different and alternating surface reactions involving two different gaseous reactants. The first reaction exposes the substrate to a pulse of a precursor gas containing molecules or atoms of interest that are to be deposited. Upon application of a pulse of precursor gas, the entire surface within the ALD chamber becomes saturated with chemisorbed molecules of the precursor gas. The atoms of interest attach the precursor gas molecules to deposition sites on the substrate surface. The second reaction exposes the substrate and attached precursor gas molecules to a pulse of second gas, typically a reducing agent, such as hydrogen, which reacts with the attached precursor gas molecules and removes undesired components of the precursor gas leaving the atoms of interest attached to the surface at the deposition sites.

The ALD system is typically purged of reactant gases in between these reactions with a non-reactive purge gas, such as argon or nitrogen, which serve to remove excess chemical species from the reaction chamber. The separate and pulsed application of the second precursor gas followed by the purge with non-reactive gas ensures that no gas-phase reactions take place in the gas-phase. Rather, chemical reactions occur on exposed surfaces within the ALD reaction chamber. The preceding sequence may be repeated with the original precursor gas or with a different precursor gas. Such a technique may readily be applied to formation of CIGS absorber layers.

ALD thus permits a IB-IIIA-VIA absorber layer (e.g., a CIGS layer) to be built up layer-by-layer, using stepwise deposition of partial atomic monolayers during each application cycle, with the aggregate growth rate directly proportional to the number of reaction cycles rather than the pressure or concentration of precursor gases in the chamber. ALD techniques can thus deposit thin films one atomic layer at a time, in a "digital" fashion. Such "digital" build-up of material greatly simplifies thickness control, thus reducing both the complexity and cost of thin film deposition. As a result, ALD provides a means for the uniform deposition of large surface areas within the ALD chamber with substantial control over film thickness, film uniformity, and high conformality, even for substrates with features exhibiting very high aspect ratios (e.g. 100:1). Importantly, while the ALD process is typically carried out at a deposition rate of less than 1 nm per deposition cycle, and is thus a relatively slow process compared to other CVD deposition techniques, the ALD process can nevertheless be scaled to ultra-high surface areas within a reaction chamber by using suitably wound and coiled substrates, using techniques such as those described herein. As ALD provides for a uniform and conformal coating even over high surface areas, the use of ALD eliminates the inconstant evaporation rates commonly experienced during co-evaporation, sputtering, or CVD processing of metals and metal organic precursors.

Some high-volume batch processes, e.g., chemical bath deposition (CBD) and atomic layer deposition (ALD), could potentially coat or otherwise treat both sides of the coiled substrate 106 at one time. However, it may be desirable to coat only one side of the substrate 106. Coating or otherwise treating both sides can result in waste of valuable reactants or may lead to extra processing steps such as removing unwanted coatings. To avoid such waste or undesired processing, two substrates may be attached together "back-to-back" to form a dual substrate having, in effect, two front sides with the back sides protected against undesired treatment. Preferably, the substrates are attached in a manner that allows them to be separated from each other after processing. By way of example the substrates may be attached with a low-strength adhesive or electrostatic film applied to the back side of one or both substrates. Alternatively, an edge where the two substrates join may be sealed, e.g., with a tape, so that reactants cannot reach the back sides during processing. The dual substrate may then be wound into a coil and coated such that both front surfaces are treated while the back surfaces are not. Processing the substrate in this fashion may reduce the waste of reactants and may increase the area of the substrate that can be processed at one time.

As set forth above, coiled-substrate ALD techniques, such as those described above, may be used to deposit an absorber layer material for an optoelectronic device such as a solar cell. By way of example, absorber layer material may include Cu with In or Ga and Se or S in a stoichiometric ratio of approximately $CuIn_{1-x}Ga_x(S, Se)_2$, where x is between 0 and 1. It should also be understood that group IB, IIIA, and VIA elements other than Cu, In, Ga, Se, and S may be included in the description of the IB-IIIA-VIA alloys described herein, and that the use of a hyphen ("-" e.g., in Cu-Se or Cu-In-Se) does not indicate a compound, but rather indicates a coexisting mixture of the elements joined by the hyphen. Where several elements can be combined with or substituted for each other, such as In and Ga, or Se, and S, in embodiments of the present invention, it is not uncommon in this art to include in a set of parentheses those elements that can be combined or interchanged, such as (In, Ga) or (Se, S). The descriptions in this specification sometimes use this convenience. Finally, also for convenience, the elements are discussed with their commonly accepted chemical symbols. Group IB elements suitable for use in the method of this invention include copper (Cu), silver (Ag), and gold (Au). Preferably the group IB element is copper (Cu). Group IIIA elements suitable for use in the method of this invention include gallium (Ga), indium (In), aluminum (Al), and thallium (Tl). Preferably the group IIIA element is gallium (Ga) and/or aluminum (Al) and/or indium (In). Group VIA elements of interest include selenium (Se), sulfur (S), and tellurium (Te), and preferably the group VIA element is either Se or S.

The proper choice of precursor materials is important for the ALD process to proceed effectively. Appropriate materials typically exhibit the following features: (I) sufficient volatility at the reaction temperatures, thermal stability with minimal or no self-decomposition, significant reactivity with the second precursor (reducing agent), and substantial insolubility of both precursors in both the product film and the underlying substrate. Limited solubility can however be tolerated if the out-diffusion of a precursor material is rapid enough to go to completion during a short purging period. Limited thermal stability can also be tolerated if the temperature ranges for the deposition processes are well controlled.

For the ALD-based synthesis of Mo layers, any of a variety of precursor materials can be used, including but not limited to molybdenum chloride, molybdenum iodide, or other halides, molybdenum ethoxide, molybdenum VI oxide bis(2,4-pentandedionate), molybdenum hexacarbonyl, molybdenum disilicide, and other organomolybdenum or organometallic precursors (for example containing Si or Ge), and combinations or mixtures of the above.

For the ALD-based synthesis of tungsten layers, any of a variety of precursor materials can be used, including but not limited to tungsten chloride or other halides, tungsten ethoxide, tungsten silicide, and other organotungsten or organometallic precursors (for example containing Si or Ge), and combinations or mixtures of the above.

For the ALD-based synthesis of vanadium layers, any of a variety of precursor materials can be used, including but not limited to vanadium chloride, vanadium iodide or other halides, vanadium tri-n-propoxide oxide, vanadium triisopropoxide oxide, vanadium trisisobutoxide, vanadium III 2,4-pentanedionate, vanadium IV oxide bis(2,4-pentanedionate), vanadium IV oxide bis(heacafluoropentanedionate), vanadium IV oxide bis(benzoylacetonate), and other organovanadium or organometallic precursors (for example containing Si or Ge), and combinations or mixtures of the above.

For the ALD-based synthesis of silicon dioxide layers, a wide variety of organometallic precursors are available, including but not limited to hexafluorosilicates, metasilicates, orthosilicates, and other organosilicon or organometallic precursors (for example containing Ge), and combinations or mixtures of the above.

For the ALD-based synthesis of chromium layers, any of a variety of precursor materials can be used, including but not limited to chromium chloride, chromium iodide, or other halides, chromium III benzoylacetonate, chromium (III) heaxafluropentanedionate, chromium III isopropoxide, chromium III 2,4-pentanedionate, chromium III 2,2,6,6-tetramethylheptanedionate, chromium III trifluoropentanedionate, chromium II acetate, chromium III acetate, chromium III 2-ethylheaxonate, and other organochromium or organometallic precursors (for example containing Si or Ge), and combinations or mixtures of the above.

For the ALD-based synthesis of CIGS absorber layers, there are several possible precursors for each of the elements in the absorber layer. For copper, suitable precursors include but are not limited to Cu(I) and Cu(II) compounds such as CuCl, copper iodide, or other copper halides, copper diketonates (e.g. Cu(II)-2,2,6,6,-tetramethyl-3,5,-heptanedionate (Cu(thd)$_2$)), Cu (II) 2,4-pentanedionate, Cu(II) hexafluroacetylacetonate (Cu(hfac)$_2$), Cu(II) acetylacetonate (Cu(acac)$_2$), Cu(II) dimethylaminoethoxide, copper ketoesters, other organocopper or organometallic precursors (for example containing Si or Ge)), and combinations or mixtures of the above. For indium, suitable precursors include but are not limited to indium chloride, indium iodide, or other indium halides, dimethylindium chloride, trimethylindium, indium 2,4-pentanedionate (indium acetylacetonate), indium hexafluoropentanedionate, indium methoxyethoxide, indium methyl(trimethylacetyl)acetate, indium trifluoropentanedionate, and other organoindium or organomettalic precursors (for example containing Si or Ge), and combinations or mixtures of the above. For gallium, suitable precursors include but are not limited to diethylgallium chloride, gallium triiodide, or other gallium halides, Ga (III) 2,4-pentanedionate, Ga (III) ethoxide, Ga(III) 2,2,6,6,-tetramethylheptanedionate, tris(dimethylaminogallium), gallium (I) salts such as gallium chloride, gallium fluoride, and gallium iodide, gallium acetate, other gallium (I)-based organometallic precursors and other organogallium or organometallic precursors (for example containing Si or Ge), and combinations or mixtures of the above. For aluminum, suitable precursors include but are not limited to aluminum chloride, aluminum iodide, or other halides, dimethylaluminum chloride, aluminum butoxides, aluminum di-s-butoxide ethylacetoacetate, aluminum diisopropoxide ethylacetoacetate, aluminum ethoxide, aluminum isopropoxide, aluminum hexafluoropentanedionate, Al(III) 2,4,-pentanedionate, Al(III) 2,2,6,6-tetramethyl3,5-heptanedionate, aluminum trifluroacetate, trisisobutylaluminum, aluminum silicate, and other organoindium or organometallic precursors (for example containing Si or Ge), and combinations or mixtures of the above.

ALD-based synthesis of CIGS absorber layers may also (optionally) use a metal organic precursor containing selenium such as dimethyl selenide, dimethyl diselenide, or diethyl diselenide or a sulfur-containing metal organic precursor, or H$_2$Se or H$_2$S, or other selenium- or sulfur-containing compounds, and combinations or mixtures of the above.

Furthermore, it may be advantageous to increase the concentration of Ga in the CIGS film, for example at the front of a CIGS absorber layer, by depositing a layer of Ga onto a just-deposited CI, CIG, or CIGS film, where the CI, CIG, or CIGS film was deposited using any of a variety of techniques, including but not limited to solution-based printing, sputtering, evaporation, and the like. To do so, ALD can be carried out using any of a range of suitable Ga precursors, including but are not limited to diethylgallium chloride, gallium triiodide, or other gallium halides, Ga (III) 2,4-pentanedionate, Ga (III) ethoxide, Ga(III) 2,2,6,6,-tetramethylheptanedionate, tris(dimethylaminogallium), and other organogallium or organometallic precursors (for example containing Si or Ge), and combinations or mixtures of the above.

For the ALD-based synthesis of cadmium sulfide, any of a variety of precursor materials can be used, including but not limited to cadmium chloride, cadmium iodide, or other halides, cadmium 2,4-pentanedionate, cadmium acetate, cadmium formate, dimethylcadmium, and other organocadmium or organometallic precursors (for example containing Si or Ge), and combinations or mixtures of the above.

Other examples of specific A and B precursors and substrate temperature ranges for both in ALD of cadmium sulfide (CdS) include the following shown in Table I:

TABLE I

| Precursor A | Precursor B | Substrate Temperature Range (° C.) |
|---|---|---|
| Elemental Cd (source temp 320° C.) | Elemental S (source temp 90-120° C.) | 350-450 |
| CdCl$_2$ (source temp 470° C.) | H$_2$S (5 sccm) | 480 |

Such CdS ALD is described e.g., by A. Kytokivi, A. et al., in *MRS Symp. Proc.* 222: 269-273, 1991, which is incorporated herein by reference.

For the ALD-based synthesis of Zinc oxide, any of a variety of precursor materials can be used, including but not limited to zinc chloride, zinc iodide, or other halides, zinc N,N-dimethylaminoethoxide, zinc methoxyethoxide, zinc 2,4-pentanedionate, zinc 2,2,6,6-tetramethyl-3,5-heptanedionate, zinc acetate, zinc bis(hexamethyldisilazide), and other organozinc or organometallic precursors (for example containing Si or Ge), and combinations or mixtures of the above.

Other examples of specific A and B precursors and substrate temperature ranges for both in ALD of Zinc Oxide (ZnO) include the following shown in Table II below:

TABLE II

| Precursor A | Precursor B | Substrate Temperature Range (° C.) |
|---|---|---|
| Dimethyl Zinc | Trimethyl Ammonium | 120-350 |
| Diethyl Zinc | Trimethyl Ammonium | 120-350 |

Such ZnO ALD is described e.g., by V. Lujala, in "Atomic layer epitaxy growth of doped zinc oxide films from organo-metals" *Applied Surface Science* 82/83: pp 34-40, 1994, which is incorporated herein by reference.

To react any of the above precursor materials on the substrate surface, ALD reactions require an additional reactant, often a reducing agent or proton-donor compound. This compound can be introduced concurrently with the first (precursor) reactant (especially if the compounds do not cross-react prior to interacting with one another at the substrate surface), or the introduction of the second reactant can be made subsequent to the introduction of the initial (precursor material). When an organometallic precursor is hydrated, a proton-donor compound may not be necessary. Reducing/proton-donating compounds include but are not limited to water ($H_2O$), methanol, ethanol, isopropyl alcohol, butyl alcohols, and other alcohols, and combinations or mixtures of these materials, as well as carbon monoxide (CO).

Oxygen gas ($O_2$) is also typically used as a second reactant, as is a mixture of $H_2O$ and $H_2O_2$.

For certain precursors, especially hexafluoro-pentanedionate (HFPD) precursors such as copper (II) hexafluoro-pentanedionate, indium hexafluoro-pentanedionate, and gallium hexafluoro-pentanedionate, formalin (37% formaldehyde, and 15% methanol in distilled deionized water) is often used as the reducing agent while nitrogen gas ($N_2$) is used as the purge gas.

For these surface reactions, an inert gas (such as nitrogen, argon, helium) is typically used as the purge gas, while hydrogen gas is often used as a reducing agent.

In some situations, a seed layer, e.g., of platinum or palladium may be deposited on the substrate before ALD with these precursors.

During the deposition process, a typical ALD cycle consists of 1-2 seconds of a first metal organic precursor pulse, followed by a 1-2 second purge, 1-2 seconds of a second metal organic precursor pulse, followed by a 1-2 second purge, (optionally) a 1-2 second pulse of a third metal organic precursor, followed by a 1-2 second purge, and (optionally) a 1-2 second pulse of a fourth metal organic precursor, followed by a 1-2 second purge, then (optionally) a 1-2 second pulse of a fifth metal organic precursor, and finally (optionally) a 1-2 second pulse of a sixth metal organic precursor. More generally, the duration of the pulse and/or purge cycles range from 0.001 seconds to 60 seconds, more preferably from 0.01 to 20 seconds, and most preferably from 0.1 to 10 seconds.

The temperature used during ALD typically ranges from 150° C. to 600° C. depending upon the chemistry and physical properties of each precursor material.

Selenium and/or sulfur may be incorporated into the absorber layer in any of several ways. In one approach, ALD may be carried out within each monolayer of a nascent absorber layer deposit using precursor gases that may include a metal organic precursor containing selenium such as dimethyl selenide, dimethyl diselenide, or diethyl diselenide and/or a sulfur-containing metal organic precursor, or $H_2Se$ or $H_2S$. In this case, selenium is incorporated on a monolayer-by-monolayer basis as the absorber film is built up through sequential deposition steps. In another approach, ALD of selenium-containing compounds can be carried out on a periodic basis where the selenium precursor deposition frequency is less than that required for initial incorporation into each monolayer. In yet another alternative approach, a nascent absorber layer can be exposed to selenium using either $H_2Se$, $H_2S$ or selenium vapor. In this case, selenization can be carried out either (a) on a monolayer by monolayer basis, or (b) periodically, where the exposure period is longer than a monolayer deposition cycles, or (c) at the end of the absorber layer deposition sequence. Combinations and/or variations of these steps can be carried out. To carry out selenization and/or sulfurization, the film, if deposited on a flexible substrate, can be wound into a coil and the coil can be coated so that the entire roll is exposed at the same time, substantially increasing the scalability of the Se vapor exposure process through such a high-volume batch process, e.g., as described above.

An additional absorber layer reduction reaction may also optionally be performed after each metal organic precursor pulse or after a sequence of two or more pulses of precursor gas. Each of these approaches has its advantages and drawbacks. For example, when each precursor pulse is followed by a reduction reaction, the reduction process is likely to be more effective since reactions take place on a relatively high surface area to volume ratio. However, the addition of repeated reduction steps can slow the overall process speed. On the other hand, if reduction is carried out only after a series of precursor pulses, the reduction process will likely be less effective since reactions take place on a relatively lower surface area to volume ratio, but eliminating the repeated reduction steps may increase the overall process speed. Thus some combination of these two approaches might work better for a given situation. Alternatively, reduction can be carried out upon completion of the deposition of the other elemental components of the absorber layer. A further complication arises from the need to ensure that the materials that form during the deposition process are not locked into a stochiometry and/or phase that cannot be later transformed into the intended target phase and stochiometry. Thus, the deposition process should be monitored and/or guided by the phase transformations that may occur as different combinations of elements are deposited within the nascent absorber film.

Embodiments of the invention are especially advantageous for the construction of solar cells based on CIGS absorber layers. For example, by use of ALD, copper, indium, gallium, and selenium can be deposited in a precise stoichiometric ratio that is intermixed at or near the atomic level. Furthermore, by changing sequence of exposure pulses for each precursor material, the relative composition of C, I, G and S within each atomic layer can be systematically varied as a function of deposition cycle and thus depth with the product deposit. Both of these features can provide benefits (such as improved power conversion efficiency) as the product deposited serves within the absorber layer of a solar cell. These benefits are much more difficult to achieve with conventional co-evaporation, sputtering, or solution-based deposition of inorganic materials used for the absorber layers of solar cells, as both the spatial uniformity and the potential resolution of atomically-graded deposition profiles of these processes is considerably less than for ALD-based deposition. Further, the reproducibility of non-ALD-based processes is less than that of ALD-based deposition.

Figures 2A, 2B:
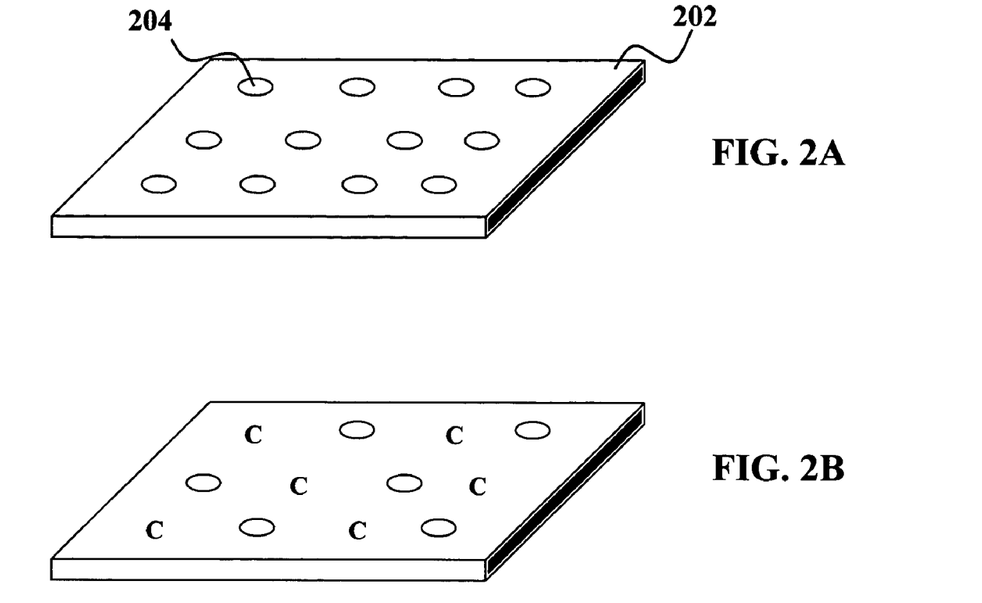
FIGS. 2A-2D are a sequence of schematic diagrams illustrating formation of a CIGS absorber layer according to an embodiment of the present invention.
Figure 2C:
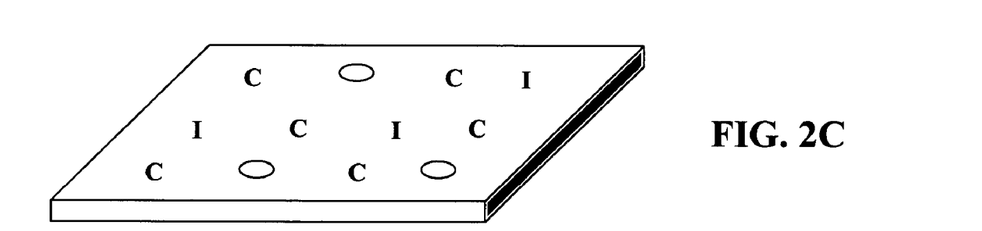
Figure 2D:
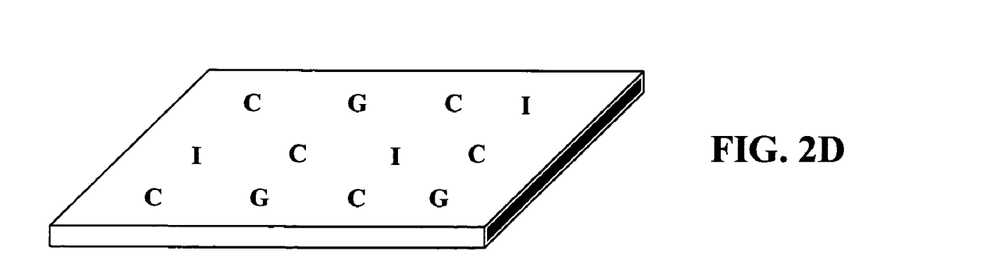

Atomic layer deposition of a CIGS absorber layer material may proceed by the sequence illustrated in FIGS. 2A-2D. Specifically, as shown in FIG. 2A, a substrate 202 may have deposition sites 204 where atoms may attach. After exposure to a copper precursor and reducing agent, copper atoms C occupy a portion of the sites 204 as shown in FIG. 2B. Other sites remain unoccupied. After exposure to an indium precursor and reducing agent, indium atoms I occupy a portion of the unoccupied sites 204 leaving other sites unoccupied as shown in FIG. 2C. After exposure to a gallium precursor and reducing agent, gallium atoms G occupy a portion of the unoccupied sites 204 as shown in FIG. 2D. In these depositions, the amount of material deposited may be controlled, e.g., by varying the number and sequence of relative exposure pulses of one precursor gas to another precursor gas, e.g. for the copper, indium and/or gallium precursor. With ALD it is possible to precisely control the stoichiometric ratio in the CIGS absorber layer in several different ways. Specifically, the sequence of atomic layer depositions of the CIGS components can be varied in a way that controls the relative stoichiometric ratios of the elemental components of the deposited film. For example, a copper:indium stoichiometric ratio of 4:3 may be achieved by a deposition sequence of four copper depositions and three indium depositions, such as C-I-C-I-C-I-C or C-C-C-C-I-I-I or C-C-I-I-I-C-C and the like, where "C" represents copper deposition and "I" represents Indium deposition. The sequence may be repeated as often as necessary to get the desired thickness. Here it is assumed that the copper and indium depositions deposit approximately equal numbers of atoms. Those of skill in the art will be able to devise other sequences that take into account variations in the deposition ratios. Furthermore, deposition sequences involving more than two different CIGS components may be sequentially used, e.g. serial deposition of cycles of C-I-G or C-I-G-S, or C-I-A-S, or C-I-G-Se-Su, and so forth. In addition, deposition sequences involving more than two different CIGS components may be performed in parallel, e.g. two or more metal-organic precursors can be introduced simultaneously in the same deposition pulse. I a preferred mode, parallel deposition of more than one metal-organic precursor occurs without reaction of those precursors prior to the surface reaction/deposition.

In other embodiments of the invention, ALD may be used to control the stoichiometric ratio of a CIGS absorber layer as a function of depth. For example, if a 4:3 copper:indium ratio is desired over a first desired thickness at the bottom of the CIGS absorber layer and a 3:4 copper:indium ratio is desired over a second desired thickness higher up in the CIGS absorber layer, then the C-I-C-I-C-I-C sequence may be repeated until the first desired thickness is achieved and a sequence I-C-I-C-I-C-I may be repeated until the second desired thickness is achieved. Those of skill in the art will be able to devise sequences that take into account variations in the deposition ratios or that use more than two different CIGS components.

Stoichiometric ratios may also be varied as a function of depth by using a deposition sequence in which the particular pulse sequence for different precursor gases vary.

Once the various CIGS components (or more generally IB-IIIA-VIA components) have been deposited by ALD they are usually annealed to form an absorber layer for a device. The annealing may be implemented by flash heating, also called rapid thermal processing. In particular, the substrate and absorber layer components may be flash heated at a rate of between about 5° C./sec and about 5° C./sec to a plateau temperature of between about 200° C. and about 550° C. The plateau time for the flash heating process may last between about 2 minutes and about 10 minutes. Such processing allows annealing of the absorber layer without damaging substrates that would otherwise be damaged by high temperature thermal processing. The combination of ALD and rapid thermal processing also allows for sharp transitions in the relative concentrations of the constituents of the absorber layer. The rapid thermal processing is typically performed only once at the end of the absorber layer deposition process. Selenization or sulfurization may be performed before or during annealing or both. Alternatively, two or more discrete or continuous annealing stases can be sequentially carried out, in which group VIA elements such as selenium or sulfur are incorporated in a second or latter stage.

Although the preceding section describes deposition of copper, indium and gallium by ALD, some of the components of the absorber layer may be deposited by techniques other than ALD. It is noted here that suitable control of the desired properties of the resulting absorber layer may be achieved even if only one component of the absorber layer is deposited by ALD. The other components may be deposited by conventional means.

Figure 3:
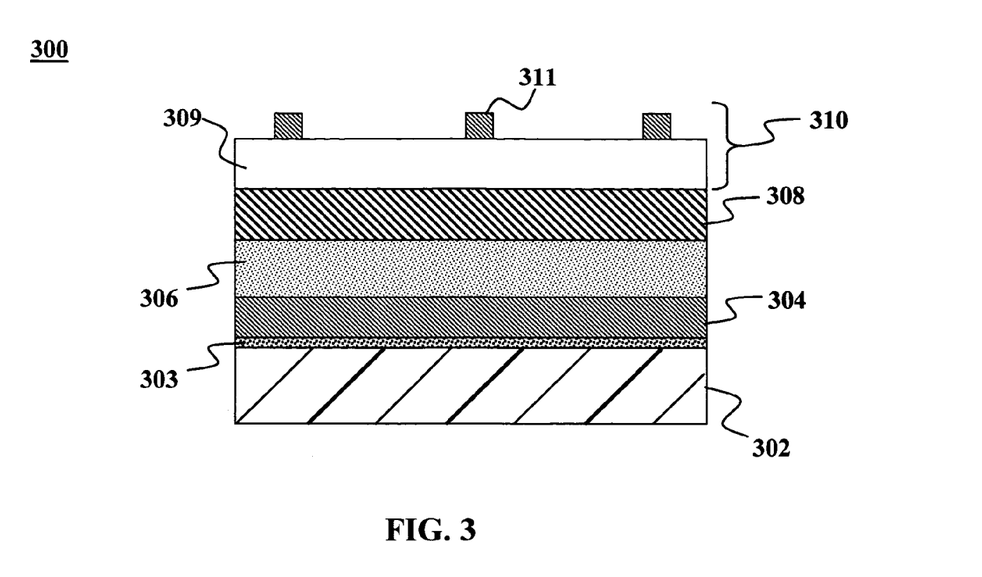
FIG. 3 is a schematic diagram of a photovoltaic cell according to an embodiment of the present invention.

A IB-IIIA-VIA alloy absorber layer formed as described above can be used in an optoelectronic device 300, e.g., as shown in FIG. 3. The device 300, which may be a solar cell, generally includes a substrate or base layer 302, a base electrode 304, an absorber layer 306, a window layer 308, and a transparent electrode 310. The base layer 302 may be made from a thin flexible material suitable for roll-to-roll processing. By way of example, the base layer 302 may be made of a metal foil, such as titanium, a polymer such as such as polyimides (PI), polyamides, polyetheretherketone (PEEK), Polyethersulfone (PES), polyetherimide (PEI), polyethylene naphtalate (PEN), Polyester (PET), or a metallized plastic. The base electrode 304 is made of an electrically conducive material. By way of example, the base electrode 304 may be a layer of stainless steel, aluminum, or molybdenum, e.g., about 0.5 micron to about 25 microns thick. An optional adhesion layer 303 may facilitate bonding of the electrode 304 to the substrate 302. By way of example, the adhesion layer 303 may be vanadium, chromium, tungsten or silicon dioxide.

The absorber layer 306 may include material containing elements of groups IB, IIIA, and VIA. Preferably, the absorber layer 306 includes copper (Cu) as the group IB, Gallium (Ga) and/or Indium (In) and/or Aluminum as group IIIA elements and Selenium (Se) and/or Sulfur (S) as group VIA elements. The absorber layer 306 may be fabricated using a sequence of atomic layer depositions on the base electrode 304. The absorber layer 306 may be about 1000 nm thick. By using atomic layer deposition as described above, the absorber layer 306 may be deposited at a temperature compatible with the underlying substrate 302 and electrode 304. Furthermore, the elemental ratios of the IB, IIIA and VIA elements in the absorber layer 306 may be precisely controlled.

The window layer 308 is typically used as a junction partner for the absorber layer 306. By way of example, the junction partner layer may include cadmium sulfide (CdS), zinc sulfide (ZnS), or zinc selenide (ZnSe) or some combination of two or more of these. Layers of these materials may be deposited, e.g., by chemical bath deposition or chemical surface deposition, to a thickness of about 50 nm to about 100 nm. The combination of the absorber layer 306 and the window layer 308 is sometimes referred to as an absorber layer.

The transparent electrode 310 may include a transparent conductive layer 309, e.g., a transparent conductive oxide (TCO) such as zinc oxide (ZnO) or aluminum doped zinc oxide (ZnO:Al), which can be deposited using any of a variety of means including but not limited to sputtering, evaporation, CBD, electroplating, CVD, PVD, ALD, and the like. If the substrate is flexible and the deposition technique is ALD or CBD or the like, a coiled/wound flexible substrate can be exposed so that the entire roll is processed at one time, e.g., as described above.

Alternatively, the transparent conductive layer 309 may include a transparent conductive polymeric layer, e.g. a transparent layer of doped PEDOT (Poly-3,4-Ethylenedioxythiophene), which can be deposited using spin, sip, or spray coating, and the like. PSS:PEDOT is a doped, conducting polymer based on a heterocyclic thiophene ring bridged by an diether. A water dispersion of PEDOT doped with poly(styrenesulfonate) (PSS) is available from H.C. Starck of Newton, Mass. under the trade name of Baytron® P. Baytron® is a registered trademark of Bayer Aktiengesellschaft (hereinafter Bayer) of Leverkusen, Germany. In addition to its conductive properties, PSS:PEDOT can be used as a planarizing layer, which can improve device performance. A potential disadvantage in the use of PEDOT is the acidic character of typical coatings, which may serve as a source through which the PEDOT may chemically attack, react with, or otherwise degrade the other materials in the solar cell. Removal of acidic components in PEDOT can be carried out by anion exchange procedures. Non-acidic PEDOT can be purchased commercially. Alternatively, similar materials can be purchased from TDA materials of Wheat Ridge, Colo., e.g. Oligotron™ and Aedotron™.

In addition to the transparent conductive layer 310, the transparent electrode 310 may further include a layer of metal (e.g., Ni, Al or Ag) fingers 311 to reduce the overall sheet resistance.

For the optoelectronic devices of the type shown in FIG. 3, an optional encapsulant layer (not shown) may provide environmental resistance, e.g., protection against exposure to water or air. The encapsulant may also absorb UV-light to protect the underlying layers. Examples of suitable encapsulant materials include one or more layers of polymers such as THZ (e.g. Dyneon's THV220 fluorinated terpolymer, a fluorothermoplastic polymer of tetrafluoroethylene, hexafluoropropylene and vinylidene fluoride), Tefzel® (DuPont), Tefdel, ethylene vinyl acetate (EVA), thermoplastics, polyimides, polyamides, nanolaminate composites of plastics and glasses (e.g. barrier films such as those described in commonly-assigned, co-pending U.S. patent application Ser. No. 10/698,988, to Brian Sager and Martin Roscheisen, filed Oct. 31, 2003, and entitled "INORGANIC/ORGANIC HYBRID NANOLAMINATE BARRIER FILM"), and combinations of the above.

Embodiments of the present invention encompass situations where the concentrations of group IB, group IIIA and group VIA elements in the IB-IIIA-VIA absorber layer 306 vary with respect to depth. For the purposes of the following discussion, the base electrode 304 and/or adhesion layer 303 is sometimes referred to as the "back" contact of the device 300. Similarly, the transparent electrode 310 is sometimes referred to as the "front" contact of the device 300. It is also noted that the base electrode 304 and adhesion layer 303 are sometimes referred to as being at or near a "back end" of the device 300. Consequently, regions of the absorber layer 306 that are close to the base electrode 304 and adhesion layer 303 are sometimes referred to as a "back region" of the absorber layer 306. Similarly, the window layer 308 and transparent electrode 310 are sometimes referred to as being at the "front end" of the device 300 and regions of the absorber layer 306 proximate the window layer 308 are sometimes referred to as a "front region." A portion of the absorber layer 506 intermediate the front and back regions is referred to herein as a "central region".

In one embodiment, the absorber layer 306 may include Cu, Ga, and/or In and Se and/or S. As described above, the Ga content may be tuned to be higher at and near both the front and back contacts of the absorber layer 306, but minimized in the central region of the absorber layer 306, resulting in a "saddle" profile for Ga concentration as a function of depth within the absorber layer 306, e.g., as shown in the graph depicted in FIG. 4. In the example depicted in FIG. 4, an absorber layer may include a first Ga-rich region 402 in the vicinity of the back end, a second Ga-rich region 404 in the vicinity of the front end, a relatively Ga-deficient central region 406 between the first and second Ga-rich regions 402, 404 and a Se-rich region 408 in the vicinity of the front end. By way of example, the first Ga-rich region 402 may be characterized by a thickness of up to about 500 nm and a Ga to In+Ga ratio of between about 10% and about 90%. The second Ga-rich region 404 may between about 5 nm and about 50 nm thick and have a ratio of Ga to In+Ga of between about 20% and about 80%. The central region 406 has a ratio of Ga to In+Ga of less than about 5%. The central region 406 may be up to about 1000 nm thick.

Figure 4:
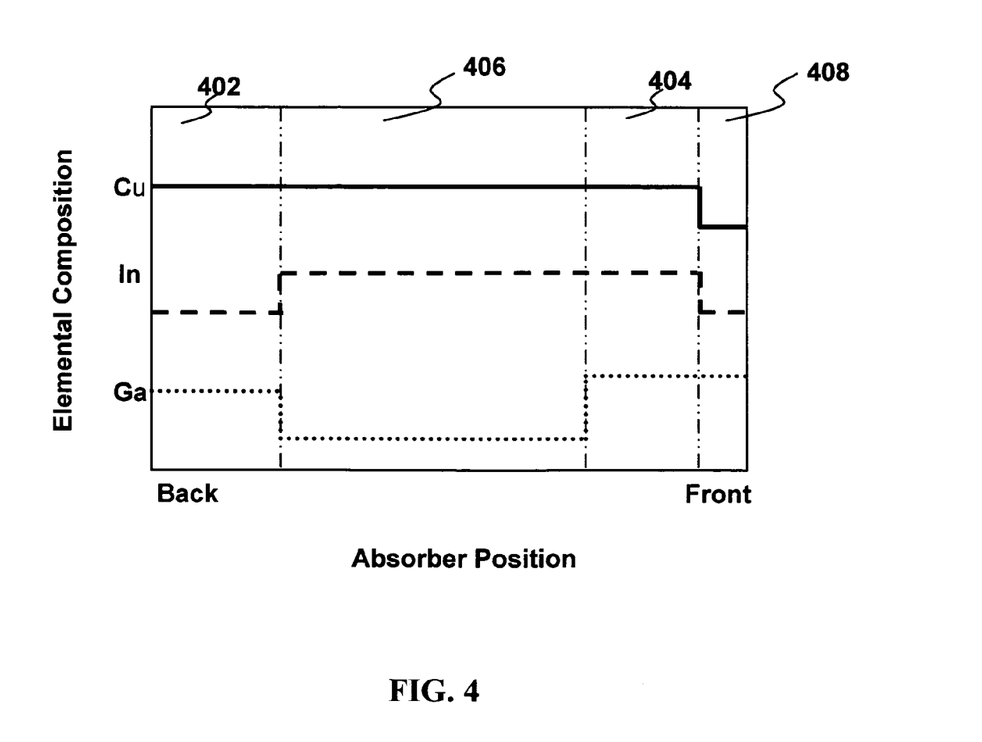
FIG. 4 is a graph illustrating concentration profiles for a CIGS absorber layer.

The Indium concentration in the absorber layer may be characterized as a ratio of Indium to Copper. In the first and second Ga-rich regions 402, 404, the ratio of In to Cu may be roughly three parts In to one part Cu. The overall In level in the first Ga-rich region 402 and the Se-rich region 408 is typically less than in other regions of the absorber layer. In the central region 406 the In:Cu ratio is roughly 0.88-0.92 parts Cu to one part In. The concentration of Cu may be measured as an atomic ratio of Cu to the group IIIA elements (e.g., In and Ga). This ratio may be as large as 90%. The ratio of Se to Cu may be roughly constant over most of the absorber layer but higher in the Se-rich region 408. For example over the first Ga-rich region 402, central region 406 and second Ga-rich region 404, the absorber layer may have a composition of $Cu_{0.9}Ga_{1-x}In_xSe_2$. At the Se-rich layer 408, the composition may be $CuIn_{3y}Ga_{3-3y}Se_5$. In the specific case where y=0, the Se-rich layer 408 may have a composition given by $CuIn_3Se_5$. The Se-rich layer may be about 20 nm thick.

The thicknesses and concentration ratios set forth above are presented for the purpose of example and in no way limit the invention. Those of skill in the art will recognize that the particular concentrations and thicknesses may be adjusted to optimize power conversion efficiency, open circuit voltage, short-circuit current density, fill factor, grain size, charge mobility and other functional and/or structural parameters of the device 300.

Although in part of the preceding section the absorber layer 306 is described as including copper, indium and gallium, those of skill in the art will recognize that the advantages of varying the stoichiometric concentration as a function of depth may be extended more generally to absorber layers of the IB-IIIA-VIA type. As such, embodiments of the invention should not be limited to absorber layers containing copper, indium and gallium.

The advantages of the coiled substrate approach of the embodiments of the present invention may be illustrated by a numerical example. Consider a coiled substrate that can fit into 16'×16'×12' space. Assume that the coil has an inner diameter of 1 meter (e.g., for a hexagonal carousel, the distance from the center to an edge of a hexagon). Assume that the coil has an outer diameter of 3 meters and that the width of the coil is 2 meters and the carousel is a little wider, e.g., 2.4 meters wide. Each turn of the coiled substrate is 1 meter long between the edges of the hexagon initially and 3 meters long when fully wound. The average length of each turn of the coiled substrate is thus 6 sides×2 m/side. If the substrate has a thickness of 0.025 mm and adjacent turns of the coiled substrate are 1 mm apart, then the coiled substrate would have about 2 m/1.025 mm=~2,000 turns about the carousel. The total area of the coiled substrate would be 2,000×2 m×6×2 m=48,000 $m^2$. In this numerical example, suppose that a deposition requires 25 repetitions of the four step sequence ACBC, i.e., filling the chamber with reactant A (e.g., a precursor), purge with inert gas C, fill with reactant B (e.g., a reducing agent), purge with inert gas C. If each purge, pump or fill step takes 10 minutes, the throughput may be estimated as the total area divided by the total number of steps and the time per step, e.g., 48,000 $m^2$/10 min/step/100 steps=48 $m^2$/min>500 square feet per minute. If the time for each step can be reduced to only 1 minute, the throughput may be increased to >5,000 square feet per minute. Because of this relatively improved deposition rate, a thick (e.g. 20 nm to as much as 2000 nm or more) CIGS absorber layers can be cost- and time-effectively deposited at high production volume. This contrasts with the prior art, where, due to the limited deposition rate of flat substrates, ALD was used only for very thin films on extremely thin absorber (ETA) cells.

Furthermore, it is possible to form most or all of the layers of an optoelectronic device by ALD in one chamber without having to remove the substrate from the chamber between steps. Specifically, with respect to a device of the type depicted in FIG. 3, the electrode layer 304 may be made of molybdenum. By way of example, molybdenum may be deposited by ALD, e.g., using $MoCl_5$ and Zinc (see e.g., M. Juppo, M. Vehkamaki, M. Ritala, and M. Leskela, *Deposition of molybdenum thin films by an alternate supply of $MoCl_5$ and Zn*, Journal of Vacuum Science & Technology A 16 (5), (1998) 2845, which is incorporated herein by reference). The absorber layer 306 may be deposited by ALD as described above, e.g., with respect to FIGS. 2A-2D, and then annealed by rapid thermal processing.

The window layer 308 may be Cadmium Sulfide (CdS) deposited by ALD. Cadmium Sulfide may be more reliably deposited by Chemical Surface Deposition, a technique described, e.g., in McCandless, B. E. and W. N. Shafarman. "Chemical Surface Deposition Of Ultra-Thin Cadmium Sulfide Films for High Performance and High Cadmium Utilization", 3rd World Conference on Photovoltaic Energy Conversion, Osaka, Japan, 2003, which is incorporated herein by reference. CdS can also be deposited by a liquid-based atomic layer epitaxy, as described e.g. in T. E. Lister and J. L. Stickney, "Formation of the first monolayer of CdSe on Au(111) by Electrochemical ALE", Appl. Surface Science, 107 (1996), 153; and T. E. Lister, and J. L. Stickney, "CdSe Deposition on Au(111) by Electrochemical ALE," *Appl. Surface Sci.,* 103 (1996) 153.), the disclosures of both of which are incorporated herein by reference. Even with such liquid based deposition techniques, the window layer 308 may be deposited in the same chamber as the other layers if the deposition chamber is suitably configured to allow for filling and draining of liquid phase reactants. Alternatively, the window layer 308 may be made of materials other than CdS that may be deposited by ALD. Examples of such materials include ZnO, Zn(O, S), ZnSe, $In_2S_3$, $TiO_2$, $Ta_2O_5$, and $Al_2O_3$, as described e.g., in the Sterner dissertation and other references cited herein.

Finally, the transparent conductive layer 309 may be ZnO deposited by ALD using diethyl zinc as a reactant and water vapor ($H_2O$) as a reducing agent. ZnO deposition by ALD is described e.g., by J. W. Elam et al, "Properties of ZnO/$Al_2O_3$ Alloy Films Grown Using Atomic Layer Deposition Techniques" Journal of The Electrochemical Society, vol. 150 no. 6, pp G339-G347 (2003), which is incorporated herein by reference. Alternatively, the transparent conductive layer 309 may be a conductive polymeric layer, e.g., of the types described above, deposited from a solution, e.g., by any of a variety of coating methods including but not limited to contact printing, top feed reverse printing, bottom feed reverse printing, nozzle feed reverse printing, gravure printing, microgravure printing, reverse microgravure printing, comma direct printing, roller coating, slot die printing, meiyerbar coating, lip direct coating, dual lip direct coating, capillary coating, ink-jet printing, jet deposition, spray deposition, and the like. The transparent electrode 310 may further include a layer of metal (e.g., Ni, Al or Ag) fingers 311 to reduce the overall sheet resistance.

In embodiments of the present invention, the scaling of the ALD process is geared towards surface area maximization, not necessarily process step speed, thus leaving enough time for each step. Consequently, pumping, purging and filling can be ensured to be high quality, thus minimizing loss of coating quality by intermixing gases, etc. Although the whole process may take a considerable period of time to complete, a vast surface area of substrate may be coated at one time.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. The appended claims are not to be interpreted as including means-plus-function limitations, unless such a limitation is explicitly recited in a given claim using the phrase "means for."

What is claimed is:

1. A method for forming an absorber layer containing elements of groups IB, IIIA and VIA, comprising the steps of:
    atomic monolayer resolution tuning of a bandgap grading of a precursor layer on a substrate, wherein the tuning occurs with spatial uniformity and resolution through deposition of at least two types of partial atomic monolayers, one of the types comprises of a different group IB, IIIA, or VIA material relative to a group IB, IIIA, or VIA material in another of the types, with aggregate growth rate directly proportional to a number of reaction cycles rather than the pressure or concentration of precursor gases in the chamber, with control over film thickness, film uniformity, and conformality;
    processing the substrate in a roll-to-roll process by using an elongate treatment chamber; wherein processing includes annealing the substrate with a precursor layer thereon in one or more steps;
    wherein the deposition of partial atomic monolayers comprises:
        exposing a target surface of the substrate to a group IB, IIIA, or VIA precursor agent and then a reducing agent, wherein deposited atoms occupy only a portion of all deposition sites on the target surface;

repeating the deposition of partial atomic monolayers using same or different group IB, IIIA, or VIA precursor agents and reducing agents until a desired atomically-graded deposition profile of at least two materials from the group consisting of group IB, IIIA, and VIA is formed in the precursor layer.

2. The method of claim 1 wherein the absorber layer is between about 25 nm and about 5000 nm thick.

3. The method of claim 1 wherein the absorber layer is between about 25 nm and about 3000 nm thick.

4. The method of claim 1 wherein the absorber layer is between about 100 nm and about 2000 nm thick.

5. The method of claim 1 wherein the absorber layer is between about 500 nm and about 2000 nm thick.

6. The method of claim 1 wherein the absorber layer is between about 1000 nm and about 2000 nm thick.

7. The method of claim 1 wherein the substrate is coiled in the treatment chamber.

8. The method of claim 7 wherein the precursor layer is formed by atomic layer deposition carried out in a stoichiometrically controlled ratio using one or more self-limiting reactions involving precursor gases of the group IB and group IIIA elements in a mix ratio that translates into a deposition ratio of the group IB and IIIA elements on the substrate, and/or by an atomic layer deposition sequence involving two or more self-limiting single species deposition reactions with precursor gases of the group IB and group IIIA elements; and incorporating an element of group VIA into the absorber layer.

9. The method of claim 7 wherein the element of group VIA is selenium or sulfur.

10. The method of claim 7 wherein incorporating the element of group VIA into the absorber layer includes exposing the film to selenium vapor, sulfur vapor, $H_2Se$, $H_2S$, one or more other selenium- or sulfur-containing compounds, or combinations or mixtures of two or more of these.

11. The method of claim 7 wherein incorporating the element of group VIA into the absorber layer involves using one or more precursor gases containing one or more elements of group VIA.

12. The method of claim 11 wherein the element of group VIA is incorporated into the absorber film through a sequence of atomic layer deposition steps.

13. The method of claim 11 wherein the sequence of atomic layer deposition steps includes the use of one or more metal organic precursors containing selenium, sulfur, $H_2Se$, $H_2S$, one or more other selenium- or sulfur-containing compounds, or combinations or mixtures of two or more of these.

14. The method of claim 13 wherein the one or more metal organic precursors containing selenium or sulfur include dimethyl selenide, dimethyl diselenide, or diethyl diselenide.

15. The method of claim 14 wherein incorporating the element of group VIA takes place either on a monolayer by monolayer basis, or periodically, with an exposure period substantially longer than a monolayer deposition cycle, or at the end of an absorber layer deposition sequence.

16. The method of claim 1 wherein performing atomic layer deposition includes exposing the substrate to one or more precursors of copper, indium, and/or gallium, and/or aluminum, and/or selenium, and/or sulfur.

17. The method of claim 16 wherein the precursors include one or more Cu(I) compounds, one or more Cu(II) compounds, CuCl, copper iodide, or other copper halides, one or more copper diketonates, Cu(II)-2,2,6,6,-tetramethyl-3,5,-heptanedionate ($Cu(thd)_2$)), Cu (II) 2,4-pentanedionate, Cu(II) hexafluoroacetylacetonate ($Cu(hfac)_2$), Cu(II) acetylacetonate ($Cu(acac)_2$), Cu(II) dimethylaminoethoxide, one or more copper ketoesters, one or more organocopper precursors containing Si or Ge, one or more other organocopper precursors and combinations or mixtures of the above, indium chloride, indium iodide, one or more other indium halides, dimethylindium chloride, trimethylindium, indium 2,4-pentanedionate (indium acetylacetonate), indium hexafluoropentanedionate, indium methoxyethoxide, indium methly(trimethylacetyl)acetate, indium trifluoropentanedionate, one or more organoindium precursors containing Si or Ge, one or more other organoindium precursors, and combinations or mixtures of the above, diethylgallium chloride, gallium triiodide, one or more other gallium halides, Ga (III) 2,4-pentanedionate, Ga (III) ethoxide, Ga(III) 2,2,6,6,-tetramethylheptanedionate, tris(dimethylaminogallium), gallium (I) salts, gallium chloride, gallium fluoride, gallium iodide, gallium acetate, other gallium (I)-based organometallic precursors, one or more organogallium precursors containing Si or Ge, one or more other organogallium precursors and combinations or mixtures of the above, aluminum chloride, aluminum iodide, or other halides, dimethylaluminum chloride, one or more aluminum butoxides, aluminum di-s-butoxide ethylacetoacetate, aluminum diisopropoxide ethylacetoacetate, aluminum ethoxide, aluminum isopropoxide, aluminum hexafluoropentanedionate, Al(III) 2,4,-pentanedionate, AI(III) 2,2,6,6-tetramethyl3,5-heptanedionat-e, aluminum trifluoroacetate, trisisobutylaluminum, aluminum silicate, one or more organoaluminum or organometallic precursors containing Si or Ge, one or more other organoaluminum or other organometallic precursors and combinations or mixtures of the above.

18. The method of claim 16 further comprising, after exposing the substrate to-one or more organometallic precursors of copper, indium, and/or gallium, and/or aluminum, and/or selenium, and/or sulfur, exposing the substrate to one or more reducing agents or proton-donor compounds.

19. The method of claim 18 wherein the one or more reducing agents or proton donor compounds include water ($H_2O$), hydrogen peroxide ($H_2O_2$), methanol, ethanol, isopropyl alcohol, one or more butyl alcohols, one or more other alcohols, carbon monoxide (CO), Oxygen gas ($O_2$), formalin, or combinations or mixtures of two or more of these.

20. The method of claim 1 wherein the precursor layer is formed by performing atomic layer deposition of one or more group IB elements and one or more group IIIA elements and includes an atomic layer deposition sequence involving two or more self-limiting single species deposition reactions with precursor gases of the group IB and group IIIA elements and varying the sequence of exposure pulses of the precursor gases.

21. The method of claim 1 wherein the precursor layer is formed by performing atomic layer deposition of the group IB and group IIIA elements and includes varying the concentration of the group IB and group IIIA elements in the absorber layer as a function of depth.

22. The method of claim 21 wherein performing atomic layer deposition of one or more group IB elements and one or more group IIIA elements includes an atomic layer deposition sequence involving two or more self-limiting single species deposition reactions with precursor gases of the group IB and group IIIA elements and varying a duration of exposure of the substrate to the precursor gases or varying the sequence of deposition reactions to vary the concentration of the group IB and group IIIA elements in the absorber layer as a function of depth.

23. The method of claim 21 wherein the sequence of deposition reactions produces a concentration of the one or more group IIIA elements that is relatively higher at and near a front region and a back region of the absorber layer, and relatively lower in a central region of the absorber layer, resulting in a "saddle" profile for the concentration of the one or more group IIIA elements as a function of depth within the absorber layer.

24. The method of claim 23 wherein the one or more group IIIA elements includes gallium (Ga) and/or Indium.

25. The method of claim 24 wherein the sequence of deposition reactions produces a Ga concentration that is relatively low at or near a back region and a central region of the absorber layer but higher at a front end, while an Indium concentration is highest in the central region of the absorber layer and lesser at both the back region and front region.

26. The method of claim 25 wherein the one or more group IB elements have a relatively higher concentration at and near the back of the absorber layer and in a relatively lesser concentration in the central and front regions of the absorber layer.

27. The method of claim 26 wherein the one or more group IB elements includes copper (Cu).

28. The method of claim 27 wherein performing atomic layer deposition of one or more group IB elements and/or one or more group IIIA elements onto the substrate includes depositing gallium by atomic vapor deposition.

29. The method of claim 1 wherein the precursor layer is formed by performing atomic layer deposition of one or more group IB elements and one or more group IIIA elements, wherein the atomic layer deposition uses a precursor gas of group IB and a precursor gas of group IIIA that do not react with each other in the gas phase during deposition.

30. The method of claim 1 wherein the precursor layer is formed by performing atomic layer deposition and includes the use of one or more precursor gases from the group of halides of copper, indium and/or gallium.

31. The method of claim 1 wherein the substrate is at least 2 m wide.

32. The method of claim 1 wherein the substrate comprises of a material selected from the group consisting of: metal foil, aluminum, alloy foil, titanium, a polymer, a polyimide, polyetheretherketone (PEEK), polyethersulfone (PES), polyetherimide (PEI), polyethylene naphthalate (PEN), Polyester (PET), and a metallized plastic.

33. The method of claim 1, further comprising incorporating an element of group VIA into the absorber layer before and/or during flash heating of the absorber layer.

34. The method of claim 33 wherein flash heating the absorber layer includes heating the absorber layer to an average plateau temperature of between about 200° C. and about 600° C.

35. The method of claim 33 wherein the flash heating lasts between about 2 minutes and about 10 minutes.

36. The method of claim 1, further comprising the step of depositing an electrode layer on the substrate by atomic layer deposition before depositing the group IB, and/or group IIIA elements.

37. The method of claim 36 wherein the electrode layer includes molybdenum.

38. The method of claim 37 wherein depositing the electrode includes the use of one or more precursors from the group of molybdenum chloride, molybdenum iodide, other halides of molybdenum, $MoCl_5$, molybdenum ethoxide, molybdenum VI oxide bis(2,4-pentandedionate), molybdenum hexacarbonyl, molybdenum disilicide, organomolybdenum precursors containing Si or Ge, other organomolybdenum precursors and combinations or mixtures of the above.

39. The method of claim 36 further comprising the step of forming an adhesion layer between the substrate and the electrode layer.

40. The method of claim 39 wherein forming the adhesion layer includes, before depositing the electrode layer, depositing a layer of vanadium, chromium, tungsten or silicon dioxide on the substrate.

41. The method of claim 40 wherein depositing the layer of vanadium, chromium, tungsten or silicon dioxide includes atomic layer deposition using one or more precursors from the group consisting of: tungsten chlorides, other halides, tungsten ethoxide, tungsten silicide, organotungsten precursors containing Si or Ge, other organotungsten precursors and combinations or mixtures of the above, vanadium chloride, vanadium iodide, other vanadium halides, vanadium tri-n-propoxide oxide, vanadium triisopropoxide oxide, vanadium trisisobutoxide, vanadium III 2,4-pentanedionate, vanadium IV oxide bis(2,4-pentanedionate), vanadium IV oxide bis (hexafluoropentanedionate), vanadium IV oxide bis(benzoylacetonate), organovanadium precursors containing Si or Ge, other organovanadium precursors and combinations or mixtures of the above, chromium chloride, chromium iodide, other chromium halides, chromium III benzoylacetonate, chromium (III) hexafluoropentanedionate, chromium III isopropoxide, chromium III 2,4-pentanedionate, chromium III 2,2,6,6-tetramethylheptanedionate, chromium III trifluoropentanedionate, chromium II acetate, chromium III acetate, chromium III 2-ethylheaxonate, organochromium precursors containing Si or Ge, other organochromium precursors and combinations or mixtures of the above, organometallic precursors containing Si or Ge, other organometallic precursors, other halides and combinations or mixtures of the above.

42. The method of claim 36 further comprising, depositing a window layer on the absorber layer.

43. The method of claim 42 wherein the window layer includes Cadmium Sulfide (CdS).

44. The method of claim 43 wherein depositing the window layer includes the use of one or more precursors selected from the group of consisting of: cadmium chloride, cadmium iodide, other halides, cadmium 2,4-pentanedionate, cadmium acetate, cadmium formate, dimethylcadmium, organocadmium precursors containing Si or Ge, other organocadmium precursors, organometallic precursors containing Si or Ge, other organometallic precursors and combinations or mixtures of the above.

45. The method of claim 43 wherein depositing the window layer on the absorber layer includes depositing the window layer and the absorber layer in the same chamber without removing the substrate between depositions.

46. The method of claim 45 wherein the window layer is deposited by atomic layer deposition, chemical surface deposition or liquid-based atomic layer epitaxy.

47. The method of claim 46, further comprising depositing a transparent electrode layer on the window layer by atomic layer deposition in the same chamber without removing the substrate between depositions.

48. The method of claim 47 wherein the transparent electrode layer includes Zinc Oxide (ZnO).

49. The method of claim 48 wherein depositing the transparent electrode includes the use of one or more precursors selected from the group consisting of: zinc chloride, zinc iodide, other zinc halides, dimethyl zinc, diethyl zinc, zinc N,N-dimethylaminoethoxide, zinc methoxyethoxide, zinc 2,4-pentanedionate, zinc 2,2,6,6-tetramethyl-3,5-heptanedionate, zinc acetate, zinc bis(hexamethyldisilazide), and organozinc or organometallic precursors containing Si or Ge, other organozinc or organometallic precursors and combinations or mixtures of the above.

50. A method for forming an absorber layer containing elements of groups IB, IIIA and VIA, comprising the steps of: performing atomic layer deposition of a group IB element from a first source and a first group IIIA element from a second source and a second group IIIA element from a third source onto a substrate to form a film; atomic monolayer resolution tuning of a bandgap grading of the precursor layer on a substrate, wherein the tuning occurs with spatial uniformity and resolution through deposition of at least two types of partial atomic monolayers, one of the types comprises of a different group IB, IIIA, or VIA material relative to a group IB, IIIA, or VIA material in another of the types, from each of the first source, the second source, and the third source, with aggregate growth rate directly proportional to a number of reaction cycles rather than the pressure or concentration of precursor gases in the chamber, with control over film thickness, film uniformity, and conformality;

wherein the deposition of partial atomic monolayers comprises:

exposing a target surface of the substrate to a group IB, IIIA, or VIA precursor agent and then a reducing agent, wherein deposited atoms occupy only a portion of all deposition sites on the target surface;

repeating the deposition of partial atomic monolayers using same or different group IB, IIIA, or VIA precursor agents and reducing agents until a desired atomically-graded deposition profile of at least two materials from the group consisting of group IB, IIIA, and VIA is formed in the precursor layer formed in the film;

annealing the film using rapid thermal processing comprising heating at a rate between about 5° C./sec and about 15° C./sec until a desired temperature is reached in a non-VIA environment to form an annealed film; and     incorporating one or more group VIA elements into the annealed film to form the absorber layer.

51. The method of claim 50 wherein the absorber layer is between about 1 nm and about 5000 nm thick.

52. The method of claim 50 wherein the group VIA element is sulfur or selenium.

53. The method of claim 50 wherein incorporating an element of group VIA into the absorber layer is performed by exposing the film to selenium vapor, sulfur vapor, $H_2Se$ or $H_2S$ one or more other selenium- or sulfur-containing compounds, or combinations or mixtures of two or more of these.

54. The method of claim 50 wherein performing atomic layer deposition of one or more group IB elements and one or more group IIIA elements includes varying the concentration of the group IB and group IIIA elements in the absorber layer as a function of depth.

55. The method of claim 54 wherein performing atomic layer deposition of one or more group IB elements and one or more group IIIA elements includes an atomic layer deposition sequence involving two or more self-limiting single species deposition reactions with precursor gases of the group IB and group IIIA elements and varying a duration of exposure of the substrate to the precursor gases or varying the sequence of deposition reactions to vary the concentration of the group IB and group IIIA elements in the absorber layer as a function of depth.

56. The method of claim 54 wherein the sequence of deposition reactions produces a concentration of the one or more group IIIA elements that is relatively higher at and near a front region and a back region of the absorber layer, and relatively lower in a central region of the absorber layer, resulting in a "saddle" profile for the concentration of the one or more group IIIA elements as a function of depth within the absorber layer.

\* \* \* \* \*